(12) United States Patent
Jung et al.

(10) Patent No.: US 7,605,069 B2
(45) Date of Patent: Oct. 20, 2009

(54) METHOD FOR FABRICATING SEMICONDUCTOR DEVICE WITH GATE

(75) Inventors: Tae-Woo Jung, Kyoungki-do (KR); Young-Hun Bae, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 206 days.

(21) Appl. No.: 11/361,937

(22) Filed: Feb. 23, 2006

(65) Prior Publication Data
US 2007/0004213 A1    Jan. 4, 2007

(30) Foreign Application Priority Data
Jun. 30, 2005    (KR) .................... 10-2005-0058741

(51) Int. Cl.
*H01L 21/4763*    (2006.01)
*H01L 21/3205*    (2006.01)

(52) U.S. Cl. .................. 438/592; 438/593; 438/594; 438/714; 438/720; 438/721

(58) Field of Classification Search ............... None
See application file for complete search history.

(56) References Cited

U.S. PATENT DOCUMENTS

| | | | |
|---|---|---|---|
| 5,491,100 A * | 2/1996 | Lee et al. ................ 438/279 |
| 5,698,072 A | 12/1997 | Fukuda | |
| 6,255,206 B1 | 7/2001 | Jang et al. | |
| 6,306,715 B1 | 10/2001 | Chan et al. | |
| 6,468,914 B1 * | 10/2002 | Jang et al. ................ 438/699 |
| 6,498,083 B2 * | 12/2002 | Nastasi et al. ............ 438/593 |
| 6,762,452 B2 * | 7/2004 | Nastasi et al. ............ 257/316 |

FOREIGN PATENT DOCUMENTS

| | | |
|---|---|---|
| CN | 1255739 | 6/2000 |
| JP | 7-122748 | 5/1995 |
| JP | 2000-196087 | 7/2000 |

* cited by examiner

*Primary Examiner*—Duy-Vu N Deo
(74) *Attorney, Agent, or Firm*—Blakely Sokoloff Taylor & Zafman

(57) ABSTRACT

A method for fabricating a semiconductor device with a gate is provided. The method includes: forming a gate insulation layer over a substrate; sequentially forming a polysilicon layer, a silicide layer and a hard mask layer over the gate insulation layer; selectively patterning the hard mask layer; etching the silicide layer using the patterned hard mask layer as a mask such that the silicide layer has a cross-sectional etch profile that is negatively sloped; etching the polysilicon layer using the patterned hard mask layer as a mask to form a gate; and performing a light oxidation process to oxidize exposed sidewalls of the polysilicon layer and the silicide layer.

15 Claims, 9 Drawing Sheets

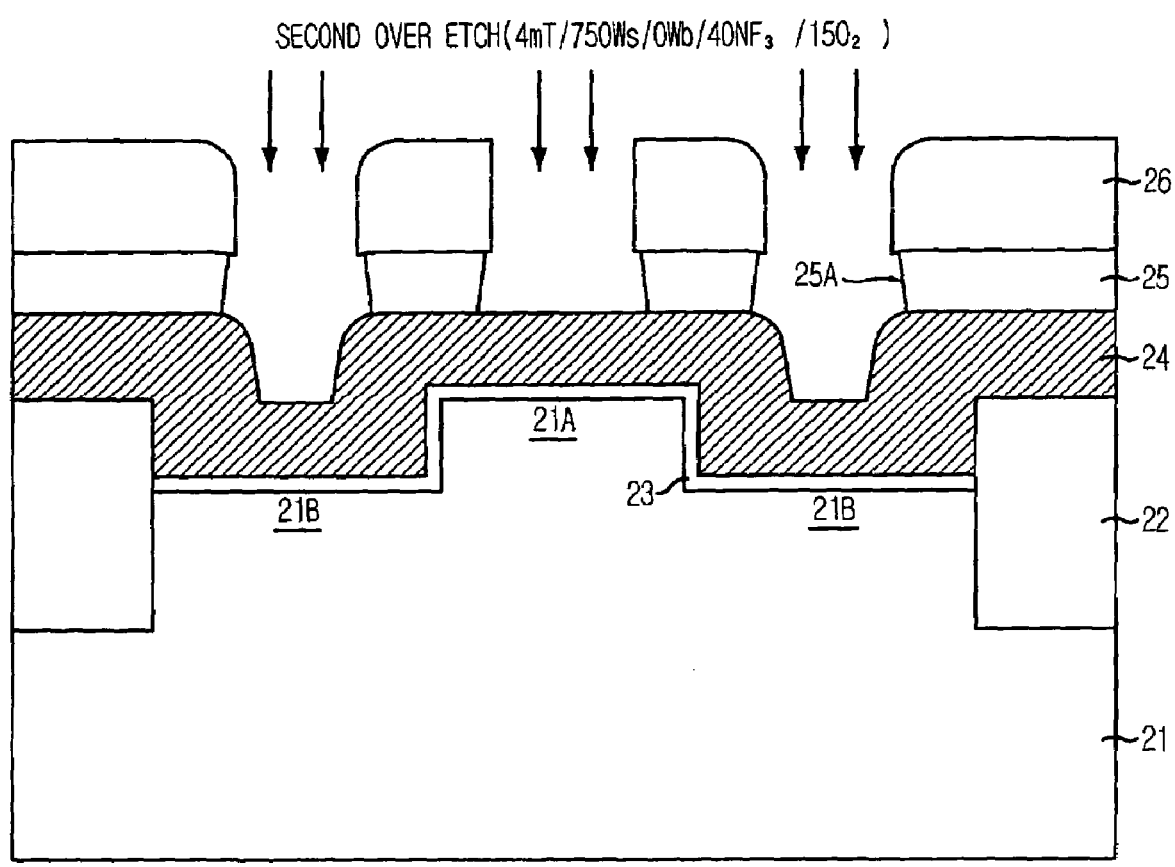

METHOD FOR FABRICATING SEMICONDUCTOR DEVICE WITH GATE

FIELD OF THE INVENTION

The present invention relates to a method for fabricating a semiconductor device; and, more particularly, to a method for fabricating a semiconductor device including a gate.

DESCRIPTION OF RELATED ARTS

Currently, a polycide gate including tungsten silicide and polysilicon is used to decrease a gate resistance. A light oxidation process, which is also called a gate re-oxidation process, recovers micro-trenches and plasma damage generated on a gate insulation layer after a gate etching process, and forms a gate bird's beak by oxidizing any electrode material remaining on the silicon substrate and increasing a thickness of the gate insulation layer at the edge sides of the gate. The light oxidation process is particularly performed to improve reliability of devices. Depending on the thickness and properties of the gate insulation layer, the gate insulation layer at the edge sides of the gate affects hot carrier characteristics, sub-threshold characteristics such as an off-leakage characteristic and a gate induced drain leakage (GIDL) characteristic, a punch-through characteristic, device operation speed, and reliability. Therefore, the light oxidation process is often essential to improve these characteristics.

SUMMARY OF THE INVENTION

It is, therefore, an object of the present invention to provide a method for fabricating a semiconductor device capable of reducing the expansion of the sidewalls of a silicide layer during a light oxidation process performed after a gate patterning process.

In accordance with an aspect of the present invention, there is provided a method for fabricating a semiconductor device including: forming a gate insulation layer over a substrate; sequentially forming a polysilicon layer, a silicide layer and a hard mask layer over the gate insulation layer; selectively patterning the hard mask layer; etching the silicide layer using the patterned hard mask layer as a mask such that the silicide layer has a cross-sectional etch profile that is negatively sloped; etching the polysilicon layer using the patterned hard mask layer as a mask to form a gate; and performing a light oxidation process to oxidize exposed sidewalls of the polysilicon layer and the silicide layer.

In accordance with another aspect of the present invention, there is provided a method for fabricating a semiconductor device including: forming a gate insulation layer over a substrate; sequentially forming a polysilicon layer, a tungsten silicide layer and a hard mask layer over the gate insulation layer; selectively patterning the hard mask layer; etching the tungsten silicide layer using the patterned hard mask layer as a mask such that the tungsten silicide layer has a cross-sectional etch profile that is negatively sloped; etching the polysilicon layer using the patterned hard mask layer as a mask to form a gate; and performing a light oxidation process to oxidize exposed sidewalls of the polysilicon layer and the tungsten silicide layer.

BRIEF DESCRIPTION OF THE DRAWINGS

The above and other objects and features of the present invention will become better understood with respect to the following description of the preferred embodiments given in conjunction with the accompanying drawings, in which:

FIGS. 3A to 3F are cross-sectional views illustrating a method for fabricating a semiconductor device in accordance with an embodiment of the present invention;

DETAILED DESCRIPTION OF THE INVENTION

A method for fabricating a semiconductor device with a gate in accordance with exemplary embodiments of the present invention will be described in detail with reference to the accompanying drawings.

Figure 1:
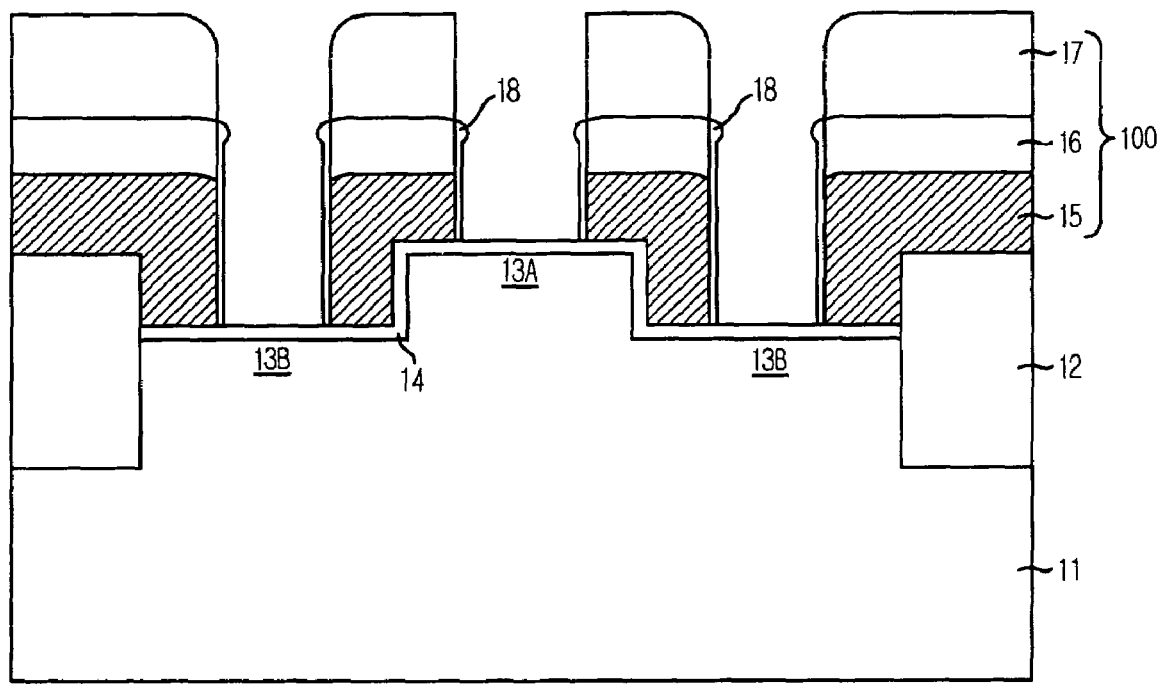
FIG. 1 is a diagram illustrating a typical semiconductor device with gates.

FIG. 1 is a diagram briefly illustrating a typical semiconductor device with gates.

As illustrated, device isolation layers 12 are formed in predetermined portions of a substrate 11, and a gate insulation layer 14 is formed on the substrate 11 in which a protruded active region 13A and recessed active regions 13B are formed based on the known method.

A polysilicon layer 15, a tungsten silicide layer 16 and a gate hard mask layer 17 are sequentially formed on the gate insulation layer 14, and a gate etching process is performed thereon to form a polycide gate 100.

A light oxidation process is performed thereafter. The light oxidation process oxidizes exposed sidewalls of the polysilicon layer 15 to form a light oxide layer 18. However, during the light oxidation process, exposed sidewalls of the tungsten silicide layer 16 are also oxidized to form the light oxide layer 18.

Because of the light oxide layer 18, the sidewalls of the tungsten silicide layer 16 are expanded, and the expanded sidewalls of the tungsten silicide layer 16 are exposed during a landing plug contact (LPC) process employing a self-aligned contact (SAC) process. As a result, a subsequent landing plug contact (LPC) and the tungsten silicide layer 16 may be shorted, inducing a SAC fail.

Figure 2A:
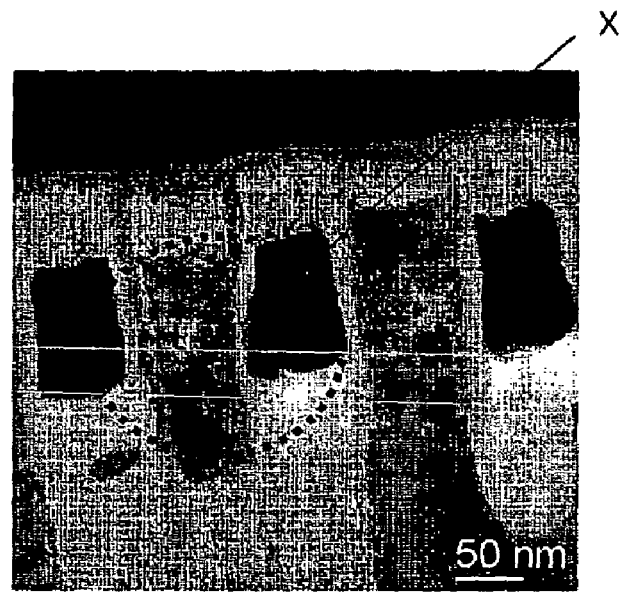
FIG. 2A is a micrographic image illustrating expanded sidewalls of a tungsten silicide layer of a typical polycide gate.
Figure 2B:
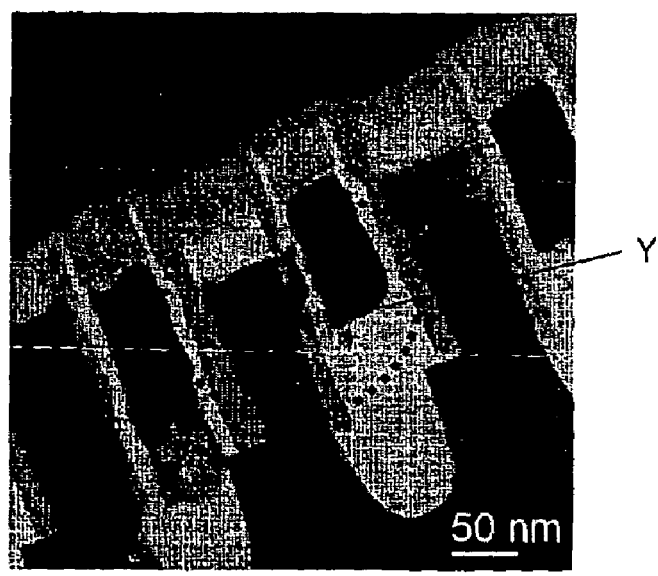
FIG. 2B is a micrographic image illustrating a short circuit event between a tungsten silicide layer and a contact.

FIG. 2A is a micrographic image illustrating expanded sidewalls of a tungsten silicide layer, and FIG. 2B is a micrographic image illustrating a short circuit event between a contact and a tungsten silicide layer. In FIGS. 2A and 2B, reference denotations 'X' and 'Y' represent the expanded sidewalls of the tungsten silicide layer and the short circuit event, respectively.

FIGS. 3A to 3F are cross-sectional views illustrating a method for fabricating a semiconductor device in accordance with an embodiment of the present invention.

Figure 3A:
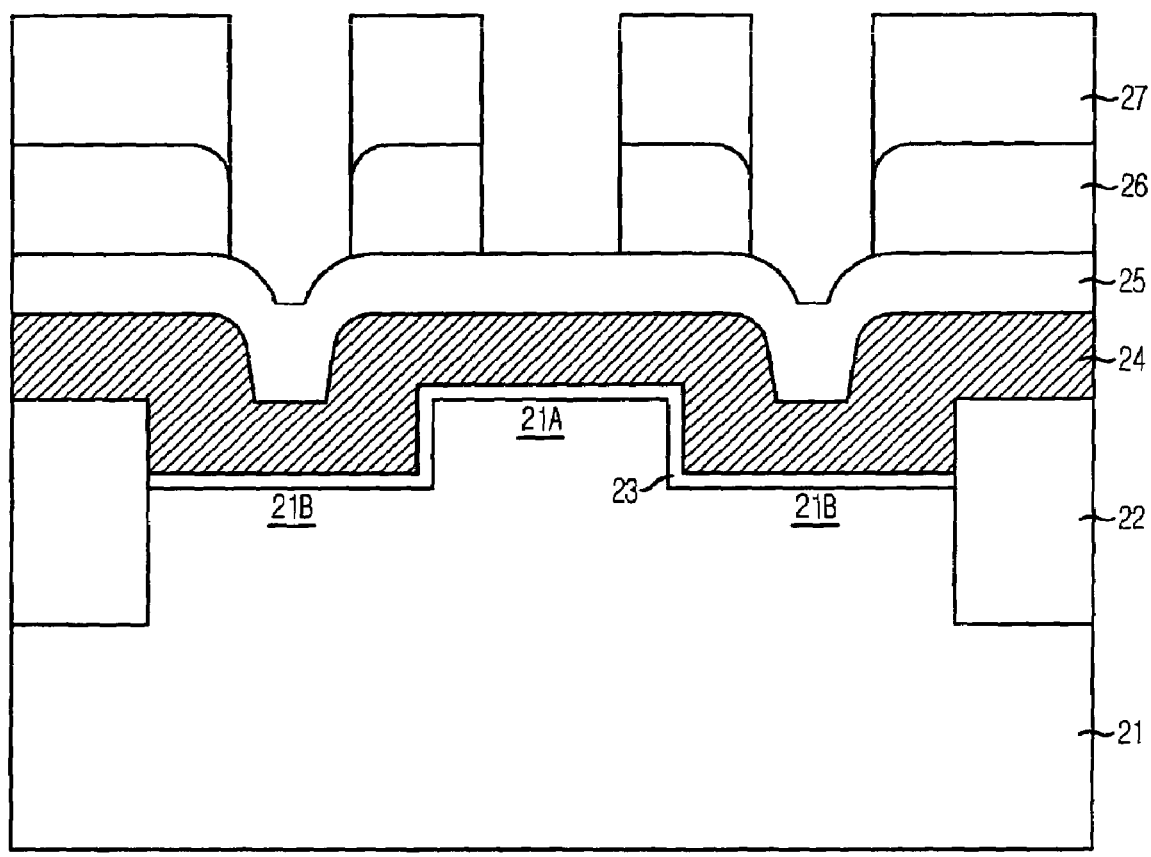

Referring to FIG. 3A, device isolation layers 22 are formed in predetermined portions of a substrate to isolate device elements from each other. The device isolation layers 22 are formed through a shallow trench isolation (STI) process, and include a high density plasma (HDP) oxide material.

The substrate 21 is recessed to form protruded active regions 21A and recessed active regions 21B, and a gate insulation layer 23 is formed over the substrate 21. A polysilicon layer 24, a tungsten silicide layer 25 and a hard mask layer 26 are sequentially formed over the gate insulation layer 23. The polysilicon layer 24, the tungsten silicide layer 25 and the hard mask layer 26 are formed to a thickness ranging from approximately 500 Å to approximately 1,200 Å, from approximately 900 Å to approximately 1,300 Å, and from approximately 2,000 Å to approximately 2,500 Å, respectively. The hard mask layer 26 includes a nitride material. Another hard mask layer including tungsten can be formed to a thickness of approximately 100 Å to approximately 300 Å.

Although not illustrated, a photoresist layer is formed over the hard mask layer 26 and patterned through a photo-exposure and developing process to form a gate mask 27, and the hard mask layer 26 is etched using the gate mask 27 as an etch mask.

For instance, the hard mask layer 26 is etched under a specific condition of: a pressure of approximately 4 mTorr; a source power of approximately 500 W; a bias power of approximately 100 W; and $CF_4$ gas of approximately 120 sccm.

Figure 3B:
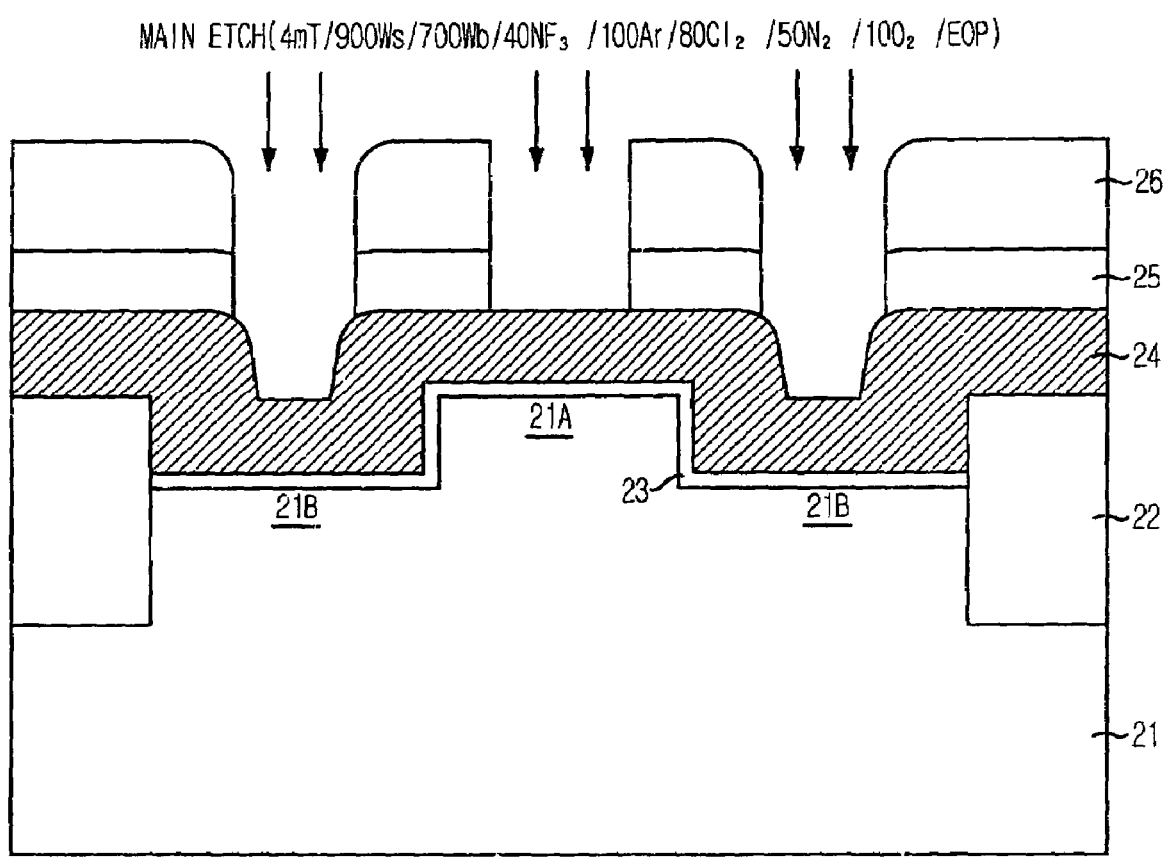

Referring to FIG. 3B, a strip process is performed to remove the gate mask 27, and a cleaning process is performed thereafter to remove etch remnants remaining after the etching of the hard mask layer 26. The tungsten silicide layer 25 is dry etched using the hard mask layer 26 as an etch mask. The etching of the tungsten silicide layer 25 includes a main etching process and an over-etching process. The main etching process is performed until the polysilicon layer 24 is exposed, and the over-etching process is performed at the point that the polysilicon layer 24 is opened. The main etching process etches the tungsten silicide layer 25 and proceeds with an end of point (EOP) scheme which detects an end point of the main etching process at the point that the polysilicon layer 24 underneath the tungsten silicide layer 25 is exposed. The over-etching process removes tungsten silicide remnants remaining after the main etching process.

For instance, the main etching process is performed under a specific condition of: a pressure of approximately 4 mTorr; a source power of approximately 900 W; a bias power of approximately 700 W; $NF_3$ gas of approximately 40 sccm; Ar gas of approximately 100 sccm; $Cl_2$ gas of approximately 80 sccm; $N_2$ gas of approximately 50 sccm; and $O_2$ gas of approximately 10 sccm. The main etching process gives a vertical etch profile in a cross-sectional view. In addition to the above condition for the main etching process, the $NF_3$ gas, $Cl_2$ gas, $N_2$ gas, and $O_2$ gas can be provided with a quantity of flow ranging from approximately 30 sccm to approximately 40 sccm, from approximately 90 sccm to approximately 100 sccm, from approximately 40 sccm to approximately 50 sccm, and from approximately 10 sccm to approximately 15 sccm, respectively. The source power can range from approximately 800 W to approximately 900 W, and the bias power can range from approximately 600 W to approximately 700 W. The pressure can range from approximately 1 mTorr to approximately 10 mTorr.

After the main etching process, the over-etching process is performed at the point that the polysilicon layer 24 is exposed. Particularly, the over-etching process includes a first over-etching process (refer to FIG. 3C) and a second over-etching process (refer to FIG. 3D).

Figure 3C:
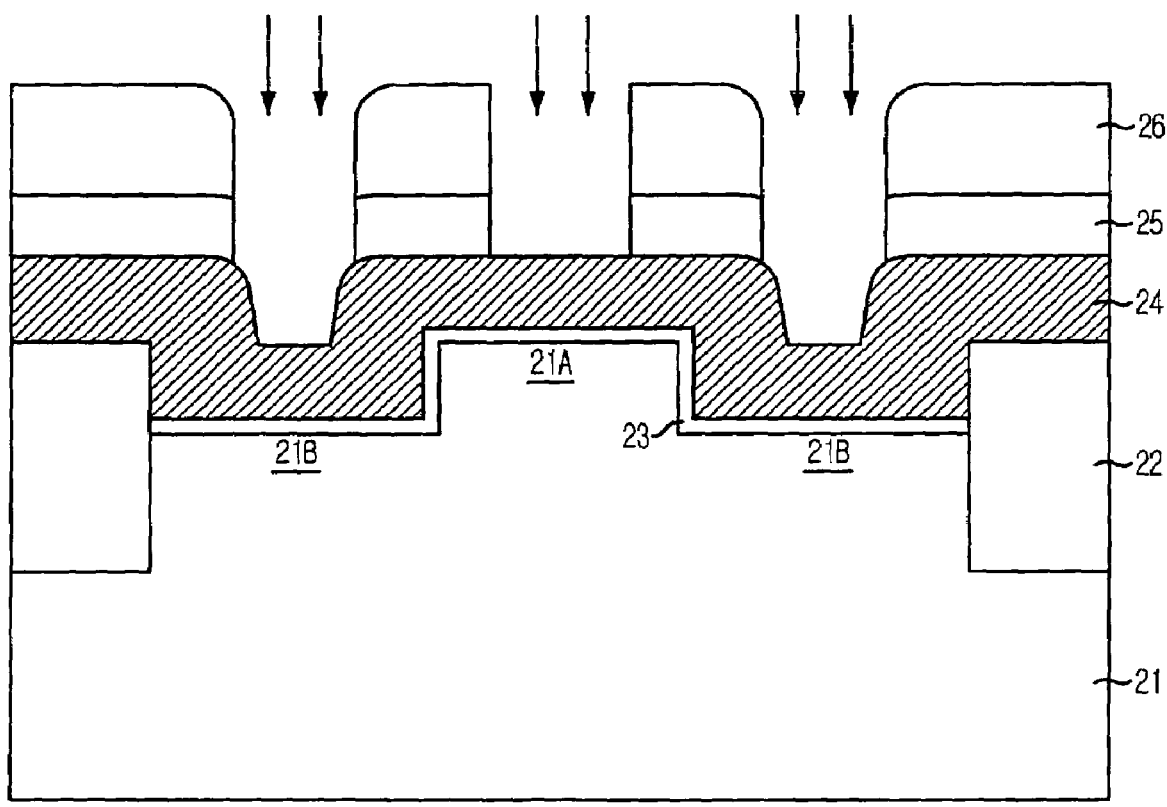

As shown in FIG. 3C, the first over-etching process is performed on the tungsten silicide layer 25 under a specific condition of: a pressure of approximately 4 mTorr; a source power of approximately 750 W; a bias power of approximately 120 W; $NF_3$ gas of approximately 10 sccm; $Cl_2$ gas of approximately 100 sccm; and $N_2$ gas of approximately 90 sccm. As shown in FIG. 3D, the second over-etching process is performed on the tungsten silicide layer 25 under a specific condition of: a pressure of approximately 4 mTorr; a source power of approximately 750 W; a bias power of approximately 0 W; $NF_3$ gas of approximately 40 sccm; and $O_2$ gas of approximately 15 sccm. The first over-etching process continues until approximately 50% of an etch target (i.e., the tungsten silicide layer 25) is over etched, and the second over-etching process over etches the rest approximately 50% of the etch target.

In detail, the first over-etching process is performed using a gas mixture of $NF_3/Cl_2/N_2$. At this point, the $NF_3$ gas of this gas mixture has a quantity of flow less than the $NF_3$ gas used in the main etching process. For instance, the flow quantity of the $NF_3$ gas for the first over-etching process is approximately 10 sccm, while that of the $NF_3$ gas for the main etching process is approximately 40 sccm. Also, Ar gas is not used in the first over-etching process. A flow quantity of the $N_2$ gas of the above gas mixture is increased so that a difference in line widths between a cell region and a peripheral region becomes larger than an intended size. The flow quantity of the $N_2$ gas for the main etching process is approximately 50 sccm, while that of the $N_2$ gas for the first over-etching process is approximately 90 sccm. For instance, the flow quantity of the $NF_3$ gas for the first over-etching process ranges from approximately 5 sccm to approximately 10 sccm. Each of the $N_2$ gas and the $Cl_2$ gas for the first over-etching process are provided with a flow quantity ranging from approximately 90 sccm to approximately 100 sccm. The source power is in a range from approximately 650 W to approximately 750 W, while the bias power is in a range from approximately 100 W to approximately 120 W. The pressure ranges from approximately 1 mTorr to approximately 10 mTorr.

Different from the first over-etching process, the second over-etching process proceeds using a gas mixture of $NF_3/O_2$ and applying a source power (i.e., a top power) of approximately 750 W. Particularly, the second over-etching process employs an isotropic etching process and is performed under an etch target of less than approximately 50 Å to induce a lateral etching of the tungsten silicide layer 25. In the second over-etching process, a bias power (i.e., a bottom power) is approximately 0 W.

As an exemplary condition for the second over-etching process, a flow quantity of the $NF_3$ gas for the second over-etching process ranges from approximately 30 sccm to approximately 40 sccm, while that of the $O_2$ gas ranges from approximately 10 sccm to approximately 15 sccm. The source power ranges from approximately 650 W to approximately 750 W, and the bias power is not applied as mentioned above. Since the bias power is not applied, damage to the bottom polysilicon layer 24 can be minimized. A pressure ranges from approximately 1 mTorr to approximately 10 mTorr.

The over-etching process including the first over-etching process and the second over-etching process has a low etch rate to the polysilicon layer 24, while maintaining substantially the same etch rate to the tungsten silicide layer 25 for the main etching process. As a result, the tungsten silicide layer 25 can be sufficiently over etched without damaging the polysilicon layer 24.

The over-etching of the tungsten silicide layer 25 by the first over-etching process and the second over-etching process induces formation of an undercut at a boundary region between the tungsten silicide layer 25 and the polysilicon layer 24. Hence, the tungsten silicide layer 25 has a negatively sloped profile 25A in the shape of an undercut (i.e., U-shape).

Figure 3E:
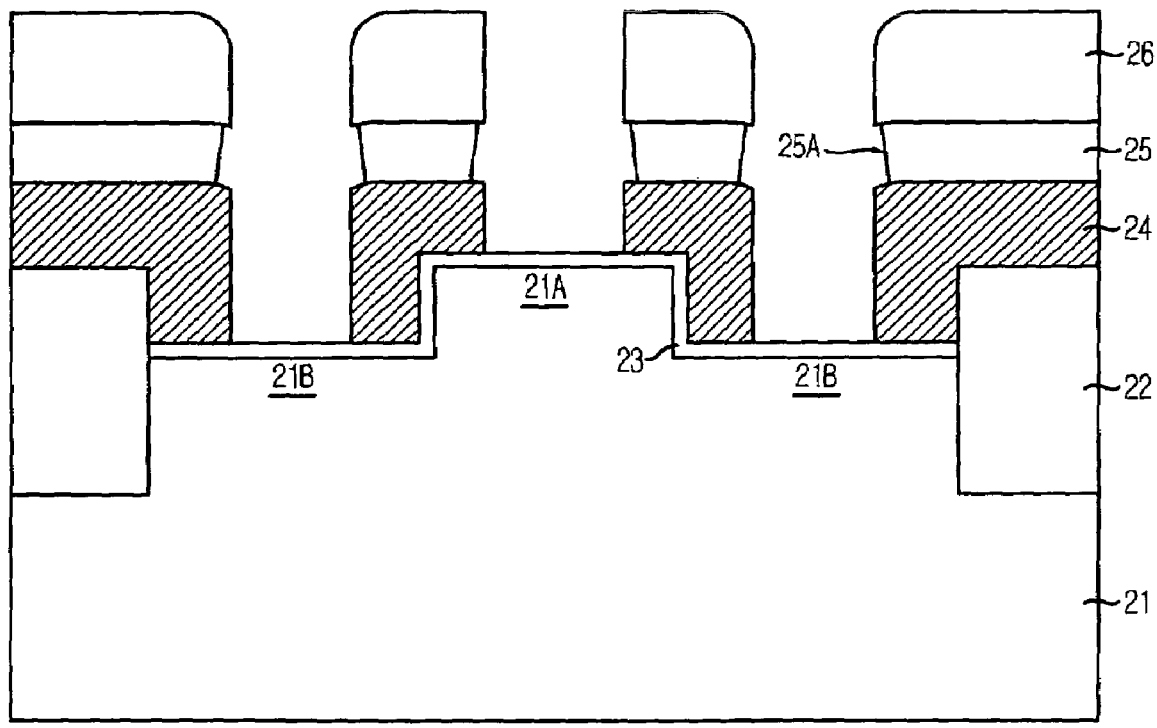

Referring to FIG. 3E, a portion of the polysilicon layer 24 exposed by the etching of the tungsten silicide layer 25 is etched. At this point, the etching of the polysilicon layer 24 proceeds with a main etching process employing an EOP scheme, which detects an end point of etching the polysilicon layer 24, and then an over-etching process at the point that the gate insulation layer 23 is exposed. For instance, the main etching process for the polysilicon layer 24 is performed under a specific condition of: a pressure of approximately 20 mTorr; a source power of approximately 400 W; a bias power of approximately 130 W; $N_2$ gas of approximately 5 sccm; and HBr gas of approximately 180 sccm. The over-etching process is performed under a specific condition of: a pressure of approximately 65 mTorr; a source power of approximately 250 W; a bias power of approximately 130 W; He gas of approximately 80 sccm; $O_2$ gas of approximately 5 sccm; and HBr gas of approximately 300 sccm. The etching of the polysilicon layer 24 may be performed at a pressure ranging from approximately 10 mTorr to approximately 30 mTorr. An etch selectivity ratio of the polysilicon layer 24 to the gate insulation layer 23 is in a range between approximately 80:1 and approximately 100:1, so that the polysilicon layer 24 after the etching process has a vertical cross-sectional area.

After the above etching process, the tungsten silicide layer 25 has a smaller width than the hard mask layer 26 and the polysilicon layer 24. That is, a final inspection critical dimension (FICD) of the tungsten silicon layer 25 is smaller than the hard mask layer 26 and the polysilicon layer 24.

Figure 3F:
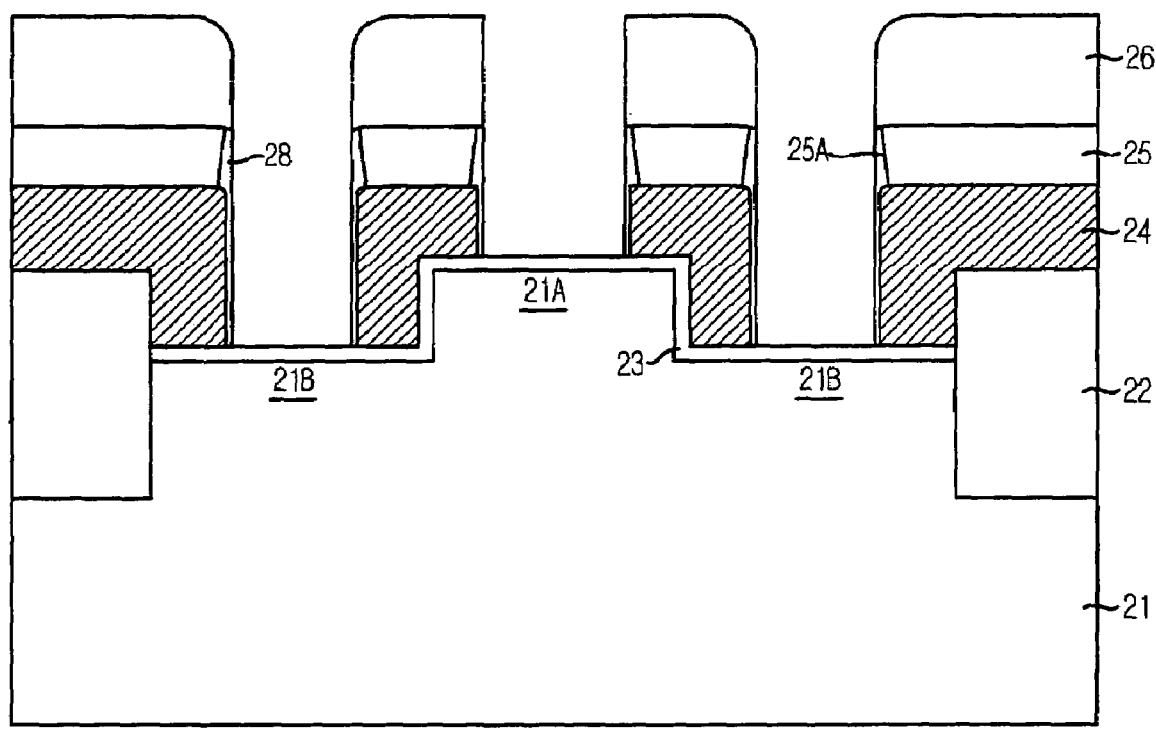

Referring to FIG. 3F, a light oxidation process is performed under an etch target of less than approximately 50 Å. The light oxidation process forms a light oxide layer 28 on exposed sidewalls of the polysilicon layer 24 and the tungsten silicide layer 25. The exposed sidewalls of the tungsten silicide layer 25 have the negatively sloped profile 25A (i.e., the undercut profile), and even if the light oxide layer 28 is formed through the light oxidation process, which oxidizes the exposed sidewalls of the tungsten silicide layer 25, the resultant gates will have a vertical profile. The vertical profile of the resultant gates can be obtained when the light oxidation process is performed under an etch target of less than approximately 50 Å.

Subsequent to the light oxidation process, although not illustrated, a nitride layer is formed to seal the gates and is used as a barrier during a subsequent etching process for forming landing plug contacts.

In the present embodiment, the tungsten silicide layer 25 is formed to have a negatively sloped profile (i.e., the undercut profile), and thus, an excessive sidewall expansion of the tungsten silicide layer 25 during the light oxidation process can be reduced.

Figure 4:
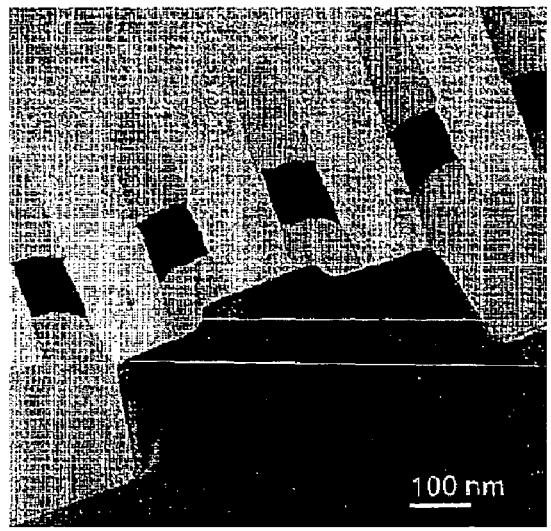
FIG. 4 is a micrographic image illustrating a cross-sectioned tungsten silicide layer in accordance with an embodiment of the present invention.

FIG. 4 is a micrographic image illustrating a cross-sectional view of an etch profile of a tungsten silicide layer included in a gate in accordance with an embodiment of the present invention. As illustrated, the tungsten silicide layer has a negatively sloped etch profile in the shape of an undercut.

Figure 5:
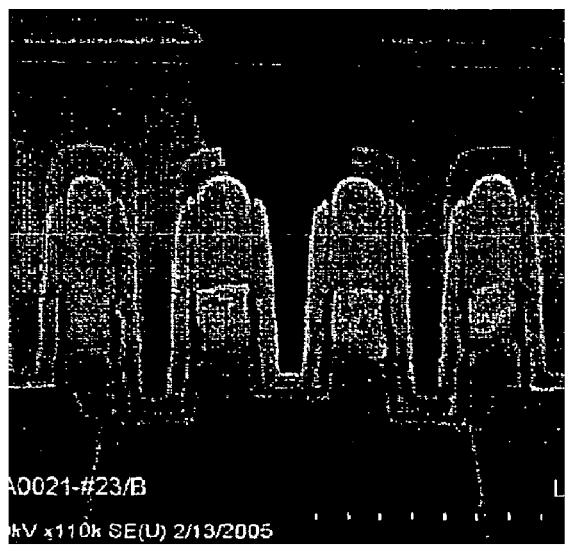
FIG. 5 is a micrographic image illustrating gates after landing plug contact holes are formed in accordance with an embodiment of the present invention.

FIG. 5 is a micrographic image illustrating a semiconductor device, wherein landing plug contact holes are formed after formation of gates in accordance with an embodiment of the present invention. As illustrated, sidewalls of a tungsten silicide layer of gates are not expanded, and thus, the sidewalls thereof are not damaged during a landing plug contact process (e.g., a self-aligned contact process).

The present embodiment describes a fabrication process of a semiconductor device with gates with a step gated array recess (STAR) structure, which can increase a channel length by forming the gates over a protruded active region and a recessed active region. However, the present embodiment can be applied to other fabrication processes such as a recess gate process and a planar gate process. Also, although the tungsten silicide layer is exemplified as the gate material in the present embodiment, other silicide materials can also be used.

The tungsten silicide layer of the gate is formed to have a negative profile in the shape of an undercut, and thus, during a light oxidation process, an excessive expansion of the sidewalls of the tungsten silicide layer can be reduced. As a result, the tungsten layer is less likely to be exposed when a subsequent self-aligned contact process is performed, and thus, it is possible to reduce an occurrence of a short circuit event between the tungsten silicide layer and a subsequent landing plug contact.

The present application contains subject matter related to the Korean patent application No. KR 2005-58741, filed in the Korean Patent Office on Jun. 30, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device comprising:
    forming a gate insulation layer over a substrate;
    sequentially forming a polysilicon layer, a silicide layer and a hard mask layer over the gate insulation layer;
    selectively patterning the hard mask layer;
    etching the silicide layer using the patterned hard mask layer as a mask such that the silicide layer has a cross-sectional etch profile that is negatively sloped;
    etching the polysilicon layer using the patterned hard mask layer as a mask to form a gate; and
    performing a re-oxidation process to oxidize exposed sidewalls of the polysilicon layer and the silicide layer,
    wherein the etching of the silicide layer includes:
    performing a main etching process until the polysilicon layer is exposed; and
    over etching the silicide layer when the polysilicon layer is exposed so that the silicide layer has the negatively sloped etch profile in the form of an undercut.

2. The method of claim 1, wherein the over etching of the silicide layer includes:
    performing a first over-etching process etching approximately 50% of the silicide layer; and
    performing a second over-etching process etching the remaining approximately 50% of the silicide layer.

3. The method of claim 2, wherein the second over-etching process employs an isotropic etching process.

4. A method for fabricating a semiconductor device comprising:
    forming a gate insulation layer over a substrate;
    sequentially forming a polysilicon layer, a tungsten silicide layer and a hard mask layer over the gate insulation layer;
    selectively patterning the hard mask layer;
    etching the tungsten silicide layer using the patterned hard mask layer as a mask such that the tungsten silicide layer has a cross-sectional etch profile that is negatively sloped;
    etching the polysilicon layer using the patterned hard mask layer as a mask to form a gate; and
    performing a re-oxidation process to oxidize exposed sidewalls of the polysilicon layer and the tungsten silicide layer, wherein the etching of the tungsten silicide layer includes:
performing a main etching process until the polysilicon layer is exposed; and
over etching the tungsten silicide layer when the polysilicon layer is exposed so that the negatively sloped etch profile is in the form of an undercut.

5. The method of claim 4, wherein the over-etching of the tungsten silicide layer includes:
performing a first over-etching process etching approximately 50% of the tungsten silicide layer to be over etched after the main etching process; and
performing a second over-etching process etching the remaining approximately 50% of the tungsten silicide layer.

6. The method of claim 5, wherein the second over-etching process employs an isotropic etching process.

7. The method of claim 5, wherein the main etching process utilizes a gas mixture of $NF_3/Ar/Cl_2/N_2/O_2$; the first over-etching process utilizes a gas mixture of $NF_3/Cl_2/N_2$; and the second over-etching process utilizes a gas mixture of $NF_3/O_2$.

8. The method of claim 7, wherein the first over-etching process uses the $NF_3$ gas with a flow quantity less than that of the $NF_3$ gas used in the main etching process and the $N_2$ gas with a flow quantity greater than that of the $N_2$ gas used in the main etching process.

9. The method of claim 7, wherein the flow quantity of the $NF_3$ gas used in the main etching process ranges from approximately 30 sccm to approximately 40 sccm; the flow quantity of the $NF_3$ gas used in the first over-etching process ranges from approximately 5 sccm to approximately 10 sccm; and the flow quantity of the $NF_3$ gas used in the second over-etching process ranges from approximately 30 sccm to approximately 40 sccm.

10. The method of claim 7, wherein the first over-etching process is performed under a condition of: a pressure of approximately 1 mTorr to approximately 10 mTorr; a source power of approximately 650 W to approximately 750 W; a bias power of approximately 100 W to approximately 120 W; a flow quantity of the $NF_3$ gas ranging from approximately 5 sccm to approximately 10 sccm; a flow quantity of the $N_2$ gas ranging from approximately 90 sccm to approximately 100 sccm; and a flow quantity of the $Cl_2$ gas ranging from approximately 90 sccm to approximately 100 sccm.

11. The method of claim 7, wherein the second over-etching process is performed under a condition of: a pressure of approximately 1 mTorr to approximately 10 mTorr; a source power of approximately 650 W to approximately 750 W; a flow quantity of the $NF_3$ gas ranging from approximately 30 sccm to approximately 40 sccm; and a flow quantity of the $O_2$ gas ranging from approximately 10 sccm to approximately 15 sccm.

12. The method of claim 11, wherein the second over-etching process is performed under an etch target of less than approximately 50 Å.

13. The method of claim 7, wherein the main etching process is performed under a condition of: a pressure of approximately 1 mTorr to approximately 10 mTorr; a surface power of approximately 800 W to approximately 900 W; a bias power of approximately 600 W to approximately 700 W; a flow quantity of the $NF_3$ gas ranging from approximately 30 sccm to approximately 40 sccm; a flow quantity of the $Cl_2$ gas ranging from approximately 90 sccm to approximately 100 sccm; and a flow quantity of the $N_2$ gas ranging from approximately 40 sccm to approximately 50 sccm; and a flow quantity of the $O_2$ gas ranging from approximately 10 sccm to approximately 15 sccm.

14. The method of claim 4, wherein the thickness of the tungsten silicide layer being oxidized in the re-oxidation process is approximately 50 Å.

15. The method of claim 4, wherein the hard mask layer and the polysilicon layer are formed to have a vertical cross-sectional etch profile and a line width larger than the tungsten silicide layer.

* * * * *